United States Patent
Jeng et al.

Patent Number: 5,904,521
Date of Patent: May 18, 1999

[54] METHOD OF FORMING A DYNAMIC RANDOM ACCESS MEMORY

[75] Inventors: Erik S. Jeng, Taipei; Yue-Feng Chen, Hsinchu, both of Taiwan

[73] Assignee: Vanguard International Semiconductor Corporation, Hsinchu, Taiwan

[21] Appl. No.: 08/919,393

[22] Filed: Aug. 28, 1997

[51] Int. Cl.$^6$ .............................................. H01L 21/8242
[52] U.S. Cl. ........................................... 438/253; 438/254
[58] Field of Search ..................................... 438/253–256, 438/296–298

[56] References Cited

U.S. PATENT DOCUMENTS 5,706,164  1/1998  Jeng et al. .
5,710,073  1/1998  Jeng et al. .

*Primary Examiner*—Jey Tsai
*Attorney, Agent, or Firm*—Christensen O'Connor Johnson & Kindness PLLC

[57] ABSTRACT

A method for forming a contact hole of a capacitor of a DRAM cell is disclosed. The method includes forming a first conductive layer on a semiconductor substrate, and forming a first dielectric layer on the first conductive layer. After patterning to etch the first dielectric layer and the first conductive layer, a second dielectric layer is formed on the semiconductor substrate and the first dielectric layer. Next, the second dielectric layer is anisotropically etched back to form a first spacer on sidewalls of the first dielectric layer and the first conductive layer. A first silicon oxide layer is formed over the semiconductor substrate, the first dielectric layer, the first spacer, followed by patterning to etch the first silicon oxide layer, wherein the first spacer and the first dielectric layer are used for facilitating self-aligned etching. Thereafter, a second conductive layer is formed over the semiconductor substrate, wherein surface of the first silicon oxide layer is exposed, and a second silicon oxide layer is formed over the second conductive layer and the first silicon oxide layer. Finally, patterning to etch a portion of the second silicon oxide layer to expose a portion of the second conductive layer, therefore a contact hole of the capacitor is formed.

19 Claims, 7 Drawing Sheets

METHOD OF FORMING A DYNAMIC RANDOM ACCESS MEMORY

TECHNICAL FIELD OF THE INVENTION

The present invention relates to a method of forming a dynamic random access memory cell, and more particularly, to a method for forming a capacitor of a DRAM cell that reduces the aspect ratio of the contact hole in the capacitor, and increases the capacitance of the DRAM cell.

BACKGROUND OF THE INVENTION

Recently, demand for semiconductor devices has rapidly increased owing to widespread use of electronic equipment. In particular, the increasing popularity of some electronic equipment such as computers, for example, is increasing the demand for large semiconductor memories.

Early DRAMs used storage cells each consisting of three transistors and were manufactured using P type channel metal-oxide-semiconductor (PMOS) technology. Later, a DRAM storage cell structure consisting of one transistor and one capacitor was developed. In fabricating the capacitor, a contact hole is firstly patterned to form a capacitor node. Next, a polysilicon patterning is performed to form a lower plate of the capacitor.

As semiconductor memory devices becomes more highly integrated, the area occupied by a capacitor of a DRAM storage cell typically shrinks. Thus, the capacitance of the capacitor is reduced owing to its smaller electrode surface area. However, a relatively large capacitance is required to achieve a high signal-to-noise ratio in reading the memory cell and to reduce soft errors (due to alpha particle interference). Therefore, it is desirable to reduce the cell dimension and yet obtain a high capacitance, thereby achieving both high cell integration and reliable operation.

Furthermore, as semiconductor memory devices become more highly integrated, the aspect ratio of the contact holes increase, resulting in difficulties in fabricating the capacitors. Accordingly, there is a need for a method of forming a DRAM capacitor having a contact hole with a low aspect ratio and high capacitance.

SUMMARY OF THE INVENTION

In accordance with the present invention, a method is provided for forming a capacitor of a DRAM cell that substantially reduces the aspect ratio of the contact hole in the capacitor, and substantially increases the capacitance of the DRAM cell. In one embodiment, a first conductive layer is firstly formed on a semiconductor substrate, and a first dielectric layer is formed on the first conductive layer. After patterning and etching the first dielectric layer and the first conductive layer, a second dielectric layer is formed on the semiconductor substrate and the first dielectric layer. Next, the second dielectric layer is anisotropically etched back to form a first spacer on sidewalls of the first dielectric layer and the first conductive layer. A first silicon oxide layer is formed over the semiconductor substrate, the first dielectric layer, the said first spacer, followed by patterning to etch the first silicon oxide layer, wherein the first spacer and the first dielectric layer are used for facilitating self-aligned etching. Thereafter, a second conductive layer is formed over the semiconductor substrate, wherein surface of the first silicon oxide layer is exposed, and a second silicon oxide layer is formed over the second conductive layer and the first silicon oxide layer. Finally, a portion of the second silicon oxide layer is patterned and etched to expose a portion of the second conductive layer. Therefore a contact hole of the capacitor is formed.

Subsequently, a third conductive layer is formed over the second silicon oxide layer, wherein the third conductive layer fills the contact hole, and a third dielectric layer is formed on the third conductive layer. After patterning and etching the third dielectric layer and the third conductive layer, a fourth dielectric layer is formed on the second silicon oxide layer. Next, the fourth dielectric layer is anisotropically etched back to form a second spacer on sidewalls of the third dielectric layer and the third conductive layer, followed by forming a third silicon oxide layer over the third dielectric layer, the second spacer, and the second silicon oxide layer. After patterning and etching the third silicon oxide layer, wherein the second spacer and the third dielectric layer are used for facilitating self-aligned etching, a fourth conductive layer is formed on the third silicon oxide layer, the third dielectric layer, the second spacer, and the second conductive layer to serve as a bottom plate of the capacitor. A sacrificial layer is formed on the fourth conductive layer, wherein portion of surface of the fourth conductive layer is exposed. Next, the fourth conductive layer is etched back to expose surface of the third silicon oxide layer, and the third silicon oxide layer and the sacrificial layer are removed. Finally, a fifth dielectric layer is formed on the fourth conductive layer, and a fifth conductive layer is formed on the fifth dielectric layer to serve as a top plate of the capacitor.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
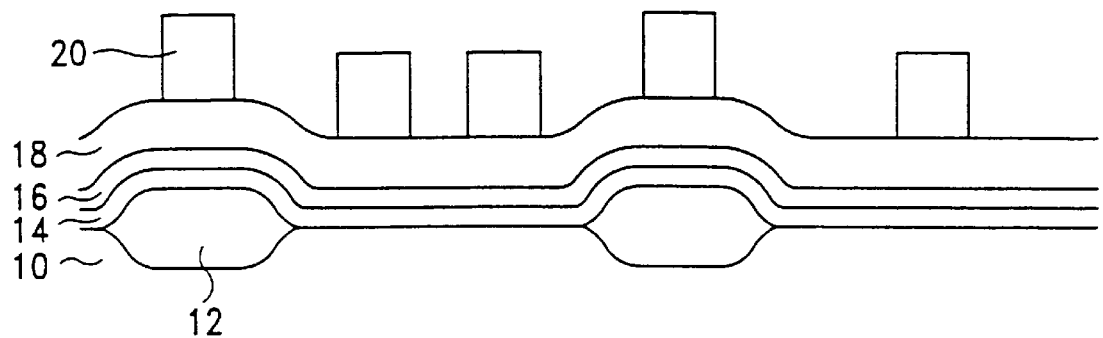
FIGS. 1–8 show cross-sectional views illustrative of various stages in the fabrication of a contact hole of a DRAM capacitor in accordance with the preferred embodiment of the present invention.

Referring to FIG. 1, a doped polysilicon layer 14 is formed on a semiconductor substrate 10 and field oxide (FOX) regions 12. In this embodiment, the polysilicon layer 14 is deposited using a standard low pressure chemical vapor deposition (LPCVD) process and is doped with phosphorous dopants at a concentration of about 5E20 atoms/$cm^2$. A silicide layer 16 is then formed using a conventional silicidation process. The combination of silicide layer 16 on top of the doped polysilicon layer 14 is usually referred to as a polycide. It is appreciated that the polycide in this embodiment may be replaced by a single doped polysilicon layer, although the latter has a higher resistivity than the former. On top of the silicide layer 16 is formed a dielectric layer 18, such as a silicon nitride layer. In this embodiment, the silicon nitride layer 18 is formed by a standard low pressure chemical vapor deposition (LPCVD).

Figure 2:
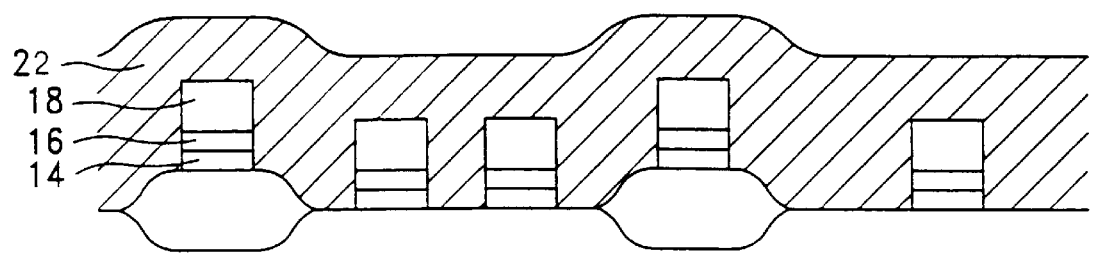

Conventional photolithography techniques are used to define gate areas in a photoresist layer 20 formed on the silicon nitride layer 18. Using the photoresist layer 20 as a mask, the silicon nitride layer 18, the silicide layer 16, and the doped polysilicon layer 14 are then etched, forming the structure shown in FIG. 2. It is observed, in this FIGURE, that the rightmost gate is used to form a peripheral contact, which will become apparent below.

Figure 3:
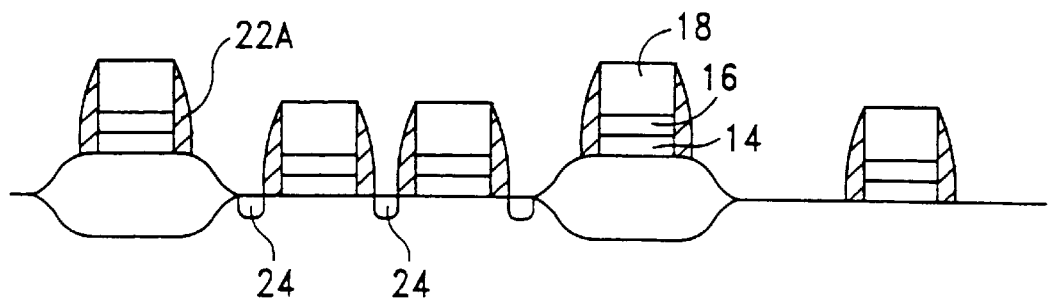

Next, a dielectric layer 22, such as a silicon nitride layer, is blanket deposited over the substrate 10 and the silicon nitride layer 18. Thereafter, an anisotropic etch, preferably a reactive ion etch process, is used to etch back the silicon nitride layer 22 so as to form spacers 22A on the sidewalls of the gate regions composed of the silicon nitride layer 18, the silicide layer 16, and the doped polysilicon layer 14 as shown in FIG. 3.

Figure 4:
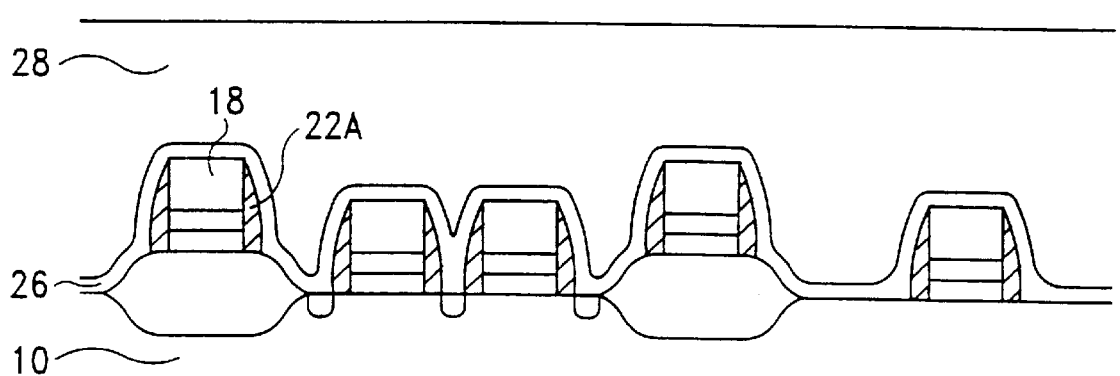

After the source/drain regions 24 are formed using conventional ion implantation techniques, a thin silicon oxide layer 26 is conformally formed over the spacers 22A, the silicon nitride layer 18, and the substrate 10 as shown in FIG. 4. The silicon oxide layer 26 is preferably deposited by a standard low pressure chemical vapor deposition (LPCVD) using tetraethylorthosilicate (TEOS) reaction gas. Over the thin silicon oxide layer 26 blanket is formed another silicon oxide layer 28. In this embodiment, a borophosphosilicate glass (BPSG) is preferably used as the silicon oxide layer 28 due to its low reflow temperature. It is observed that the thin silicon oxide layer 26 under the BPSG layer 28 is used as a barrier layer to prevent autodoping of boron (B) or phosphor (P) from the BPSG layer 28 down to the underlying devices.

Figure 5:
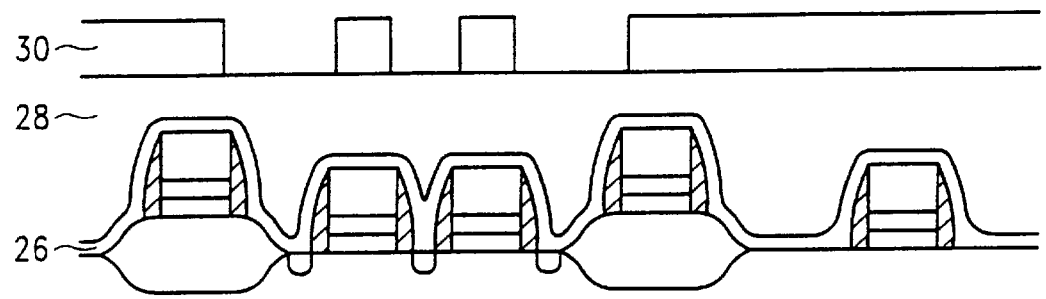

A conventional etch back or chemical-mechanical polishing (CMP) process is then performed to etch back a suitable thickness of the BPSG layer 28, thereby planarizing the surface of the BPSG layer 28 as shown in FIG. 5.

Figure 6:
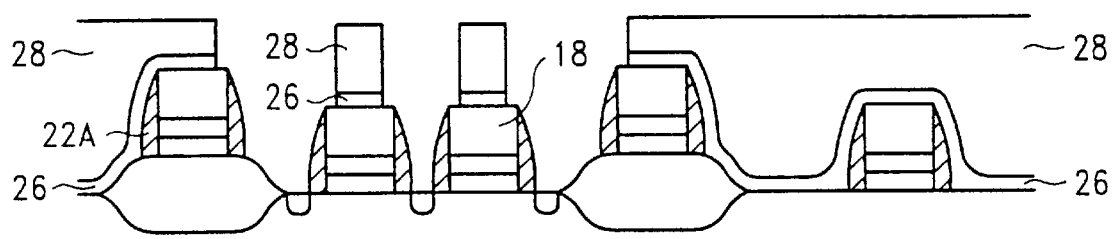

Conventional photolithography techniques are then used to define areas in a photoresist layer 30 formed on the BPSG layer 28 over a portion of each gate. Using the photoresist layer 30 as a mask, the BPSG layer 28 and the silicon oxide layer 26 are then etched, resulting in the structure as shown in FIG. 6. It is observed that the spacers 22A and the silicon nitride layer 18 serve as a self-aligned contact (SAC) structure.

Figure 7:
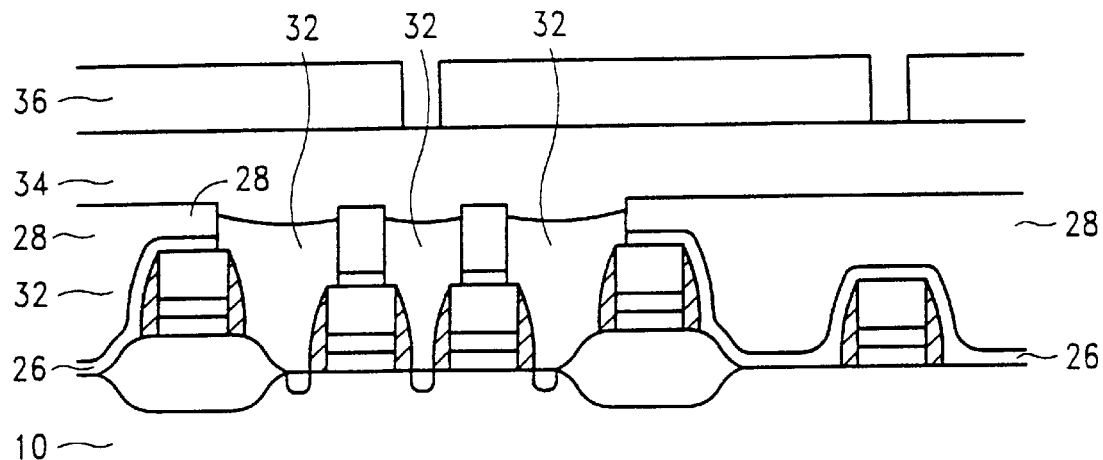
Figure 8:
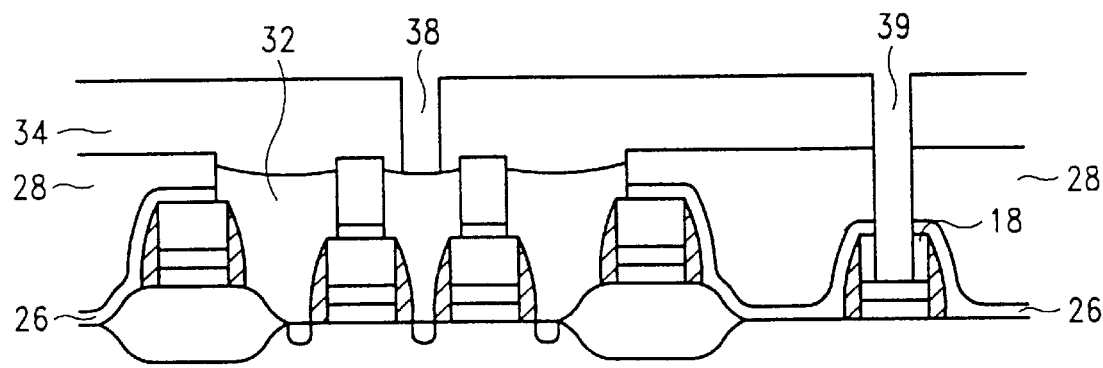

Turning next to FIG. 7, a doped polysilicon layer 32 is deposited over the structure in FIG. 6, followed by an etching back until the surface of the BPSG layer 28 is exposed. Polysilicon contact plugs 32 are therefore formed over the exposed substrate 10. Next, a silicon oxide layer 34 is deposited over the polysilicon contact plugs 32 and the BPSG layer 28. In this embodiment, a borophosphosilicate glass (BPSG) is preferably used as the silicon oxide layer 34. Conventional photolithography techniques are then used to define a contact hole in a photoresist layer 36 formed on the silicon oxide layer 34. Using the photoresist layer 36 as a mask, a bit-line contact hole 38 is formed by etching the silicon oxide layer 34, wherein the polysilicon contact plug 32 serves as end point step as shown in FIG. 8. Further, a contact hole 39 is also formed in the peripheral area, where the silicon oxide layer 34, the polysilicon contact plug 32, and the silicon nitride layer 18 are etched. Contrary to the conventional process, the peripheral contact hole 39 and the bit-line contact hole 38 may be advantageously formed simultaneously according to the embodiment of the present invention. Furthermore, it is noted that the contact hole 38 has a reduced aspect ratio smaller than a conventional one.

Figure 9:
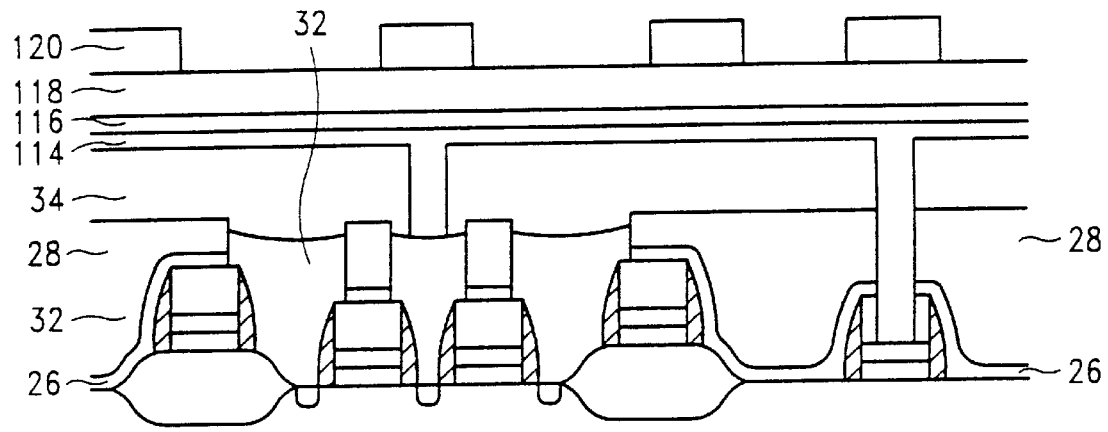
FIGS. 9–14 further show cross-sectional views illustrative of various stages in the fabrication of the DRAM capacitor in accordance with the preferred embodiment of the present invention.

Referring to FIG. 9, a doped polysilicon layer 114 is formed on the silicon oxide layer 34 and the exposed polysilicon contact plug 32. In this embodiment, the polysilicon layer 114 is deposited using a standard low pressure chemical vapor deposition (LPCVD) process and is doped with phosphorus dopants at a concentration of about 5E20 atoms/cm$^2$. A silicide layer 116 is then formed using conventional silicidation process. The combination of silicide layer 116 on top of the doped polysilicon layer 114 is usually referred to as polycide. It is appreciated that the polycide in this embodiment may be replaced by a single doped polysilicon layer, although the latter has a higher resistivity than the former. On top of the silicide layer 116 is formed a dielectric layer 118 such as silicon nitride. In this embodiment, this silicon nitride layer 118 is formed by a standard low pressure chemical vapor deposition (LPCVD).

Figure 10:
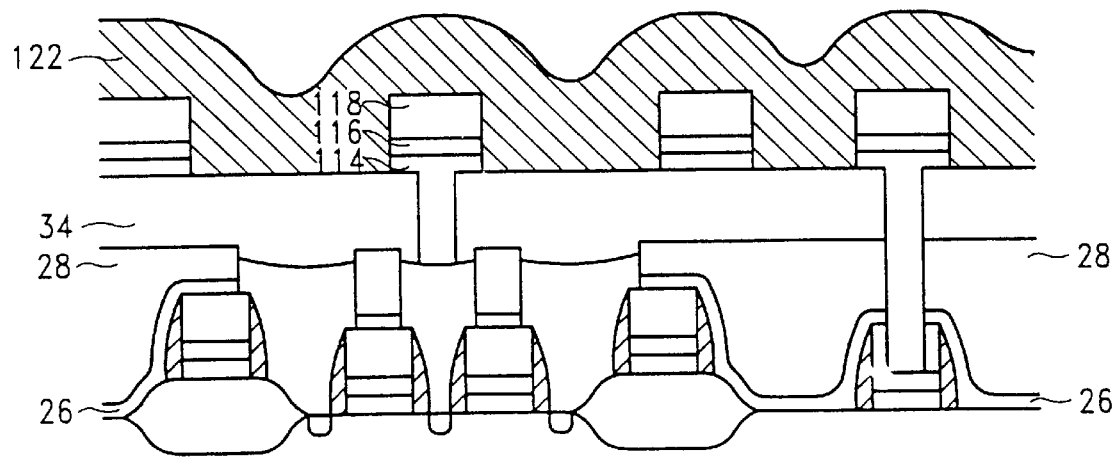

Conventional photolithography techniques are used to define gate areas in a photoresist layer 120 formed on the silicon nitride layer 118. Using the photoresist layer 120 as a mask, the silicon nitride layer 118, the silicide layer 116, and the doped polysilicon layer 114 are then etched, forming the structure shown in FIG. 10.

Figure 11:
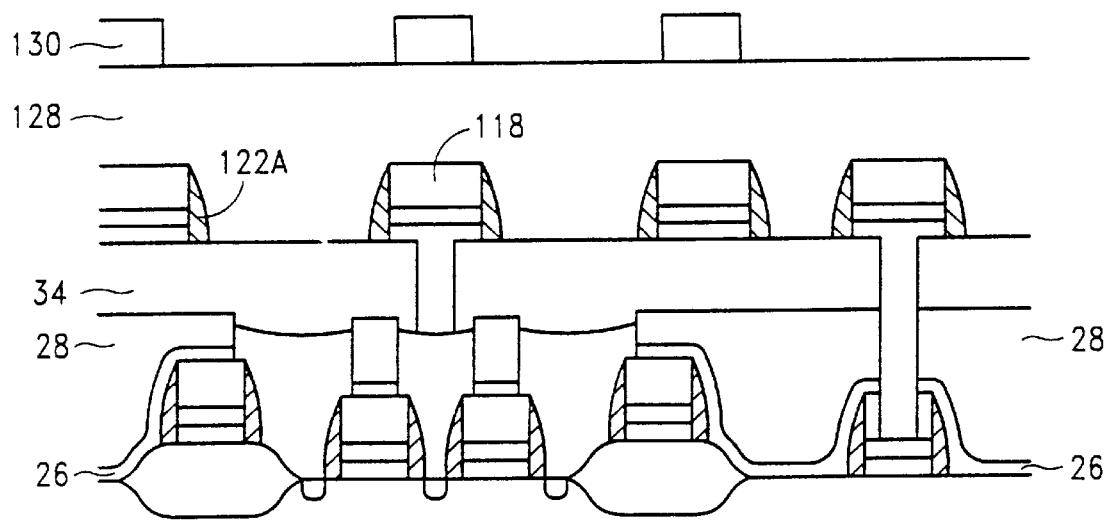

Next, a dielectric layer 122 such as a silicon nitride layer is blanket deposited over the silicon nitride layer 118 and the silicon oxide layer 34. Thereafter, an anisotropic etch, preferably a reactive ion etch process, is used to etch back the silicon nitride layer 122 so as to form spacers 122A on the sidewalls of the regions composed of the silicon nitride layer 118, the silicide layer 116, and the doped polysilicon layer 114 as shown in FIG. 11.

Over the spacers 122A, the silicon nitride layer 118 and the silicon oxide layer 34 blanket is formed another silicon oxide layer 128. In this embodiment, a borophosphosilicate glass (BPSG) is preferably used as the silicon oxide layer 128 due to its low reflow temperature.

Figure 12:
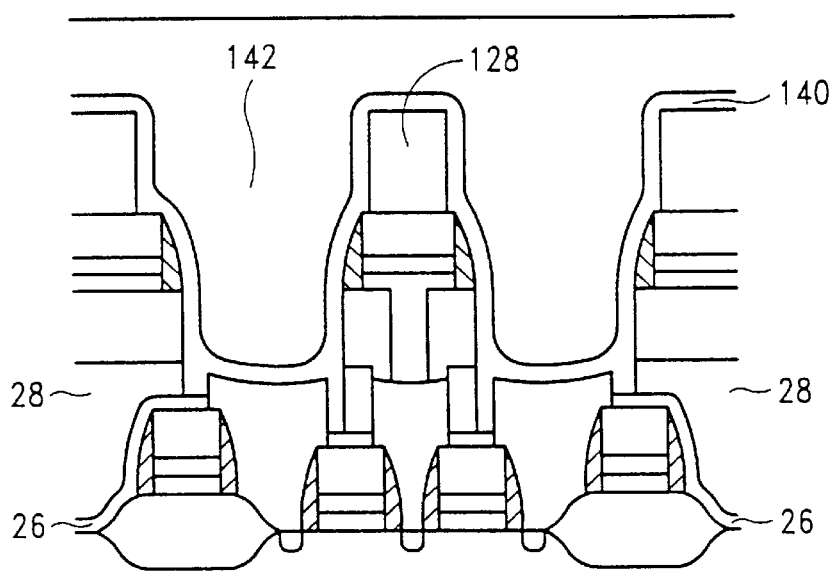

Conventional photolithography techniques are then used to define areas in a photoresist layer 130 formed on the BPSG layer 128. Using the photoresist layer 130 as a mask, the BPSG layer 128 is then etched, resulting in the structure as shown in FIG. 12. It is observed that the spacers 122A and the silicon nitride layer 118 serve as a self-aligned contact (SAC) structure.

Figure 13:
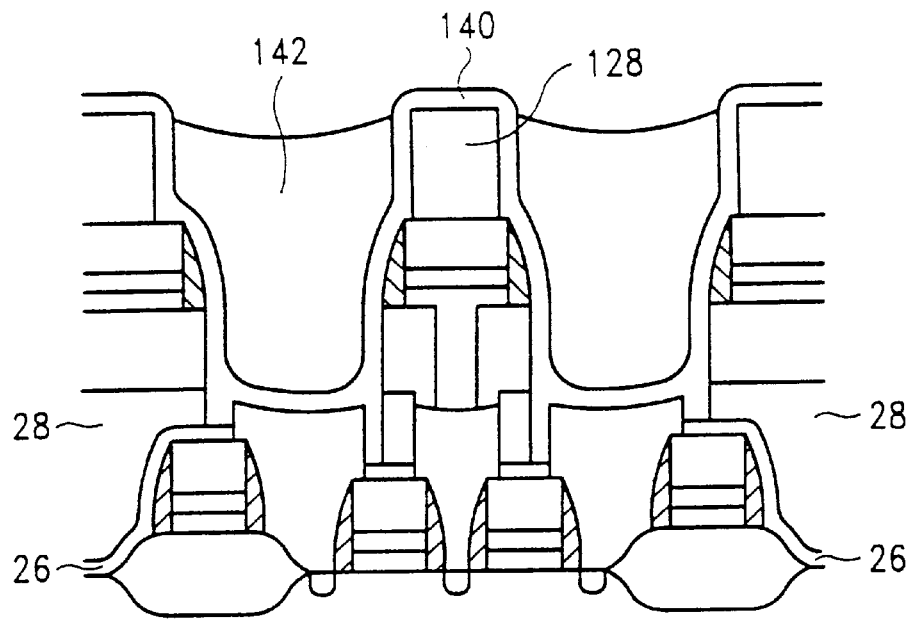

Referring to FIG. 12, a polysilicon layer 140 is blanket formed over the structure from the previous step, and acts as the bottom plate of the DRAM capacitor. A dielectric layer 142 such as a photoresist layer or organic polymer layer is coated over the polysilicon layer 140 using a conventional silicon-on-glass (SOG) technique, followed by an etching back to expose the surface of the polysilicon layer 140 as shown in FIG. 13. The dielectric layer 142 may be alternatively replaced by depositing silicon oxide such as borophosphosilicate glass (BPSG).

Figure 14:
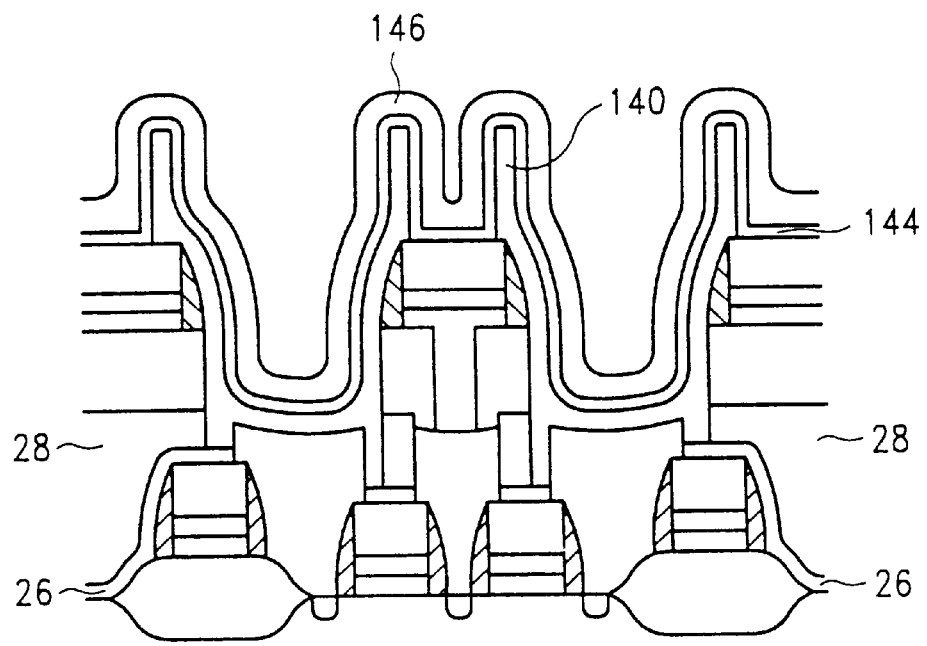

The polysilicon layer 140 is then etched back until the silicon oxide layer 128 is exposed as shown in FIG. 14. After the silicon oxide layer 128 and the SOG layer 142 are removed, a thin dielectric layer 144 is formed on the polysilicon layer 140. In this embodiment, a stacked oxide-nitride-oxide (ONO) is used as the dielectric layer 144. As is known in the art of DRAM fabrication, the ONO film is reliable over shaped silicon surfaces, and is typically used as a capacitor insulator. The bottom oxide layer of the stacked oxide-nitride-oxide (ONO) film 144 is conventionally formed by thermally oxidizing the silicon surface, depositing an LPCVD silicon nitride layer and then oxidizing the silicon nitride layer to form the top oxide layer. A conductive layer 146 is then deposited over the stack oxide/silicon nitride/oxide layer 144 to serve as an upper plate of the DRAM cell capacitor. Typically, the conductive layer 146 is a doped polysilicon layer formed in the same manner as the polysilicon layer 14. Other material such as Ta$_2$O$_5$ may be alternatively used to replace the dielectric layer 144.

Although specific embodiments have been illustrated and described, it will be obvious to those skilled in the art that various modifications may be made without departing from the spirit which is intended to be limited solely by the appended claims.

What is claimed is:

1. A method for forming a contact hole of a bit line of a dynamic random access memory, said method comprising:

forming a first conductive layer on a semiconductor substrate;

forming a first dielectric layer on said first conductive layer;

patterning and etching said first dielectric layer and said first conductive layer to form a gate structure;

forming a second dielectric layer on said semiconductor substrate and said first dielectric layer;

anisotropically etching back said second dielectric layer to form a spacer on the sidewalls of said gate structure;

forming a first silicon oxide layer over said semiconductor substrate, said gate structure, and said spacer;

patterning and etching said first silicon oxide layer, wherein said spacer and said first dielectric layer are used for facilitating self-aligned etching;

forming a second conductive layer over the semiconductor substrate such that the surface of said first silicon oxide layer remains exposed;

forming a second silicon oxide layer over said second conductive layer and said first silicon oxide layer; and patterning and etching a portion of said second silicon oxide layer to expose a portion of said second conductive layer, thereby forming the contact hole of the bit line.

2. The method according to claim 1, wherein said first conductive layer comprises polycide.

3. The method according to claim 1, wherein said first and second dielectric layer comprise silicon nitride.

4. The method according to claim 1, wherein said first silicon oxide layer comprises borophosphosilicate glass (BPSG).

5. The method according to claim 4, further comprising etching back said first silicon oxide layer.

6. The method according to claim 4, further comprising forming a silicon oxide layer before forming said first silicon oxide layer to serve as a barrier layer.

7. The method according to claim 1, wherein said second conductive layer comprises doped polysilicon.

8. The method according to claim 1, wherein said second silicon oxide layer comprises borophosphosilicate glass (BPSG).

9. A method for forming a capacitor of a dynamic random access memory, said method comprising:

forming a first conductive layer on a semiconductor substrate;

forming a first dielectric layer on said first conductive layer;

patterning and etching said first dielectric layer and said first conductive layer to form a gate structure;

forming a second dielectric layer on said semiconductor substrate and said first dielectric layer;

anisotropically etching back said second dielectric layer to form a spacer on the sidewalls of said gate structure;

forming a first silicon oxide layer over said semiconductor substrate, said gate structure, and said spacer;

patterning and etching said first silicon oxide layer, wherein said spacer and said first dielectric layer are used for facilitating self-aligned etching;

forming a second conductive layer over the semiconductor substrate such that the surface of said first silicon oxide layer remains exposed;

forming a second silicon oxide layer over said second conductive layer and said first silicon oxide layer;

patterning and etching a portion of said second silicon oxide layer to expose a portion of said second conductive layer, thereby forming the contact hole of the bit line;

forming a third conductive layer over the second silicon oxide layer, said third conductive layer filling said contact hole;

forming a third dielectric layer on said third conductive layer;

patterning and etching said third dielectric layer and said third conductive layer to leave a stack structure of said third conductive layer and said third dielectric layer;

forming a fourth dielectric layer by blanket depositing on said second silicon oxide layer;

anisotropically etching back said fourth dielectric layer to form a second spacer on the sidewalls of said stack structure;

forming a third silicon oxide layer over said stack structure, said second spacer, and said second silicon oxide layer;

patterning and etching said third silicon oxide layer, wherein said second spacer and said stack structure are used for facilitating self-aligned etching;

forming a fourth conductive layer on said third silicon oxide layer, said third dielectric layer, said second spacer, and said second conductive layer to serve as a bottom plate of the capacitor;

forming a sacrificial layer on said fourth conductive layer leaving a portion of surface of said fourth conductive layer being exposed;

etching back said fourth conductive layer to expose the surface of said third silicon oxide layer;

removing said third silicon oxide layer and said sacrificial layer;

forming a fifth dielectric layer on said fourth conductive layer; and forming a fifth conductive layer on said fifth dielectric layer to serve as a top plate of the capacitor.

10. The method according to claim 9, wherein said first and third conductive layer comprise polycide.

11. The method according to claim 9, wherein said first, second, third, and fourth dielectric layer comprise silicon nitride.

12. The method according to claim 9, wherein said first, second, and third silicon oxide layer comprises borophosphosilicate glass (BPSG).

13. The method according to claim 12, further comprising etching back said first silicon oxide layer.

14. The method according to claim 12, further comprising forming a silicon oxide layer before forming said first silicon oxide layer to serve as a barrier layer.

15. The method according to claim 9, wherein said second, fourth, and fifth conductive layer comprises doped polysilicon.

16. The method according to claim 9, wherein said second silicon oxide layer comprises borophosphosilicate glass (BPSG).

17. The method according to claim 9, wherein said fifth dielectric layer comprises stacked oxide-nitride-oxide or $Ta_2O_5$.

18. The method according to claim 1, wherein said patterning and etching of said second oxide layer further comprises etching a portion of said first silicon oxide layer and said first dielectric layer to expose a portion of said first conductive layer, thereby forming a contact hole of said first conductive layer.

19. The method according to claim 9, wherein said patterning and etching of said second oxide layer further comprises etching a portion of said first silicon oxide layer and said first dielectric layer to expose a portion of said first conductive layer, thereby forming a contact hole of said first conductive layer.

* * * * *